United States Patent
Hawryluk et al.

(10) Patent No.: US 9,190,570 B2
(45) Date of Patent: Nov. 17, 2015

(54) LASER ANNEALING OF GAN LEDS WITH REDUCED PATTERN EFFECTS

(71) Applicants: Andrew M. Hawryluk, Los Altos, CA (US); Yun Wang, Sarasota, CA (US)

(72) Inventors: Andrew M. Hawryluk, Los Altos, CA (US); Yun Wang, Sarasota, CA (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 13/678,946

(22) Filed: Nov. 16, 2012

(65) Prior Publication Data
US 2014/0131723 A1 May 15, 2014

Related U.S. Application Data

(60) Provisional application No. 61/567,842, filed on Dec. 7, 2011.

(51) Int. Cl.
*H01L 29/10* (2006.01)
*H01L 29/76* (2006.01)
(Continued)

(52) U.S. Cl.
CPC ............ *H01L 33/32* (2013.01); *H01L 33/0075* (2013.01); *H01L 33/0095* (2013.01); *H01L 33/38* (2013.01)

(58) Field of Classification Search
USPC ............ 257/76, 13, E21.093, 192, 194, 257/E29.246–E29.253, E21.403, E21.407, 257/20, E21.395, E21.399, 257/E29.069–E29.071, E29.245, 257/E49.001–E49.004, E21.404, 40, 257/79–103, 918, E51.018–E51.022, 257/E33.001–E33.077, E33.054, E25.028, 257/E25.032, 116, 117, 432–437, 749,257/E33.056–E33.059, 457, 459, E21.077, 257/E21.082, E21.333, E21.12, E21.324, 257/E21.454, E21.497, E33.075; 438/609, 438/167, 172, 22–47, 69, 493, 503, 507, 438/956, 502, 509, 660–664, 530, 540, 550
See application file for complete search history.

(56) References Cited

U.S. PATENT DOCUMENTS

| 6,200,827 B1 | 3/2001 | Kimura et al. |
| 6,455,877 B1 | 9/2002 | Ogawa et al. |

(Continued)

FOREIGN PATENT DOCUMENTS

| JP | 2000-174339 A | 6/2000 |
| JP | 2007-220709 | 2/2006 |

(Continued)

OTHER PUBLICATIONS

Search Report for counterpart Singapore Patent Application No. 201208409-1, dated Jul. 4, 2012, from Hungarian Intellectual Property Office.

(Continued)

*Primary Examiner* — Dao H Nguyen
*Assistant Examiner* — Tram H Nguyen
(74) *Attorney, Agent, or Firm* — Opticus IP Law PLLC

(57) ABSTRACT

The disclosure is directed to laser annealing of GaN light-emitting diodes (LEDs) with reduced pattern effects. A method includes forming elongate conductive structures atop either an n-GaN layer or a p-GaN layer of a GaN LED structure, the elongate conductive structures having long and short dimensions, and being spaced apart and substantially aligned in the long dimensions. The method also includes generating a P-polarized anneal laser beam that has an anneal wavelength that is greater than the short dimension. The method also includes irradiating either the n-GaN layer or the p-GaN layer of the GaN LED structure through the conductive structures with the P-polarized anneal laser beam, including directing the anneal laser beam relative to the conductive structures so that the polarization direction is perpendicular to the long dimension of the conductive structures.

15 Claims, 12 Drawing Sheets

(51) Int. Cl.
  *H01L 31/036* (2006.01)
  *H01L 31/112* (2006.01)
  *H01L 33/32* (2010.01)
  *H01L 33/38* (2010.01)
  *H01L 33/00* (2010.01)

(56) References Cited

U.S. PATENT DOCUMENTS

| | | |
|---|---|---|
| 6,747,245 B2 | 6/2004 | Talwar et al. |
| 7,154,066 B2 | 12/2006 | Talwar et al. |
| 7,259,399 B2 | 8/2007 | Lee et al. |
| 7,399,945 B2 | 7/2008 | Talwar et al. |
| 7,436,001 B2 | 10/2008 | Lee et al. |
| 8,460,959 B2 | 6/2013 | Wang et al. |
| 8,592,309 B2 | 11/2013 | Wang et al. |
| 2003/0178633 A1 | 9/2003 | Flynn et al. |
| 2004/0084427 A1 | 5/2004 | Talwar et al. |
| 2005/0179130 A1 | 8/2005 | Tanaka et al. |
| 2006/0289886 A1* | 12/2006 | Sakai ............................ 257/98 |
| 2007/0018177 A1 | 1/2007 | Lee et al. |
| 2009/0114630 A1* | 5/2009 | Hawryluk .......... B23K 26/0066 219/121.85 |
| 2009/0127578 A1 | 5/2009 | Masuya |
| 2010/0123118 A1 | 5/2010 | Hu et al. |
| 2010/0156679 A1* | 6/2010 | Ehrlichman et al. ............ 341/50 |
| 2011/0108796 A1 | 5/2011 | Wang et al. |
| 2011/0204376 A1 | 8/2011 | Su et al. |
| 2011/0278587 A1* | 11/2011 | Wang et al. ..................... 257/76 |
| 2011/0309374 A1* | 12/2011 | Wang .................. H01L 33/0095 257/76 |
| 2013/0026448 A1* | 1/2013 | Chu et al. ........................ 257/13 |
| 2013/0341310 A1 | 12/2013 | Van Der Wilt |

FOREIGN PATENT DOCUMENTS

| | | |
|---|---|---|
| JP | 2006-339656 | 12/2006 |
| WO | WO 2013/172965 | 5/2012 |

OTHER PUBLICATIONS

First Japanese Office Action for Japanese Counterpart Patent Application No. 2012-249286.
Second Japanese Office Action for Japanese Counterpart Patent Application No. 2012-249286.
Singapore Examination Report for counterpart Singapore Patent Application No. 2012084091.
Taiwan Office Action for Taiwan Counterpart Patent Application No. 101143583.

* cited by examiner

LASER ANNEALING OF GAN LEDS WITH REDUCED PATTERN EFFECTS

CROSS-REFERENCE TO RELATED APPLICATIONS

This application is related to U.S. patent application Ser. No. 12/590,360, filed on Nov. 6, 2009, and entitled "Laser spike annealing of GaN LEDs," which application is incorporated by reference herein.

This Application claims priority from U.S. Provisional Patent Application Ser. No. 61/567,842, filed on Dec. 7, 2011, which Application is incorporated by reference herein.

FIELD

The present disclosure relates generally to light-emitting diodes (LEDs), and in particular to system for and methods of laser annealing of GaN LEDs in a manner that reduces or minimizes adverse pattern effects.

BACKGROUND ART

LEDs (and in particular GaN LEDs) have proven useful for a variety of lighting applications (e.g., full-color displays, traffic lights, etc.), and have potential for even more applications (e.g., backlighting LCD panels, solid state lighting to replace conventional incandescent lamps and fluorescent lights, etc.) if these LEDs can be made more efficient and can also be manufactured more cost-effectively. To realize higher efficiency for GaN LEDs, they need to have enhanced output power, lower turn-on voltage and reduced series resistance. The series resistance in GaN LEDs is closely related to the efficiency of dopant activation, uniformity of current spreading, and ohmic contact formation. To realize manufacturing cost-effectiveness, improvements in the manufacturing process that result in better processing uniformity and a reduction on adverse processing effects is desirable.

In GaN, a n-type dopant can be readily achieved using Si and with an activation concentration as high as $1 \times 10^{21}$ cm$^{-3}$. The p-type GaN can be obtained by using Mg as the dopant. The efficiency of Mg doping, however, is quite low due to its high thermal activation energy. At room temperature, only a few percent of the incorporated Mg contributes to the free-hole concentration. Mg doping is further complicated during MOCVD growth because of hydrogen passivation during the growth process. Hydrogen passivation requires a thermal annealing step to break the Mg—H bonds and activate the dopant.

A GaN LED typically includes conductive contacts and conductive current-spreading electrodes to power the LED. However, the resulting pattern can interfere with the laser annealing process and give rise to so-called adverse "pattern effects." To improve the performance of a GaN LED, it would be desirable to perform laser annealing of the LED structure after the current spreading electrodes are formed. Consequently, there is a need for systems and methods of performing laser annealing that reduces adverse pattern effects when laser annealing through conductive structures.

SUMMARY

The disclosure is directed to laser annealing of GaN light-emitting diodes (LEDs) with reduced pattern effects. An aspect of the disclosure is a method that includes forming elongate conductive structures atop either an n-GaN layer or a p-GaN layer of a GaN LED structure, the elongate conductive structures having long and short dimensions, and being spaced apart and substantially aligned in the long dimensions. The method also includes generating a P-polarized anneal laser beam that has an anneal wavelength that is greater than the short dimension. The method also includes irradiating either the n-GaN layer or the p-GaN layer of the GaN LED structure through the conductive structures with the P-polarized anneal laser beam, including directing the anneal laser beam relative to the conductive structures so that the polarization direction is perpendicular to the long dimension of the conductive structures.

In the method, the elongate conductive structure preferably has a surface that is generally rectangular.

In the method, the substantial alignment of the elongate conductive structures preferably includes two or more of the elongate conductive structures being parallel.

In the method, the elongate conductive structures preferably define current-spreading electrodes.

The method preferably further includes adding at least one contact pad that electrically contacts the current-spreading electrodes, after the irradiating.

In the method, the anneal wavelength may be about 10.6 microns.

The method preferably further includes scanning with the anneal laser beam over the conductive structures.

In the method, the GaN LED structures may be formed on a product substrate. And the method preferably further includes dicing the product substrate to form LED dies from the GaN LED structures.

The method preferably further includes incorporating the LED dies into an LED device structure to form an LED device.

Another aspect of the disclosure is a GaN light-emitting diode (LED) apparatus suitable for laser annealing with a P-polarized anneal laser beam having an anneal wavelength. The apparatus includes: a GaN multilayer structure that includes p-GaN and n-GaN layers that sandwich an active layer; and a plurality of conductive structures formed atop either the p-GaN layer or the n-GaN layer, the conductive structures each being elongate with a long dimension and a short dimension and aligned generally in the same direction, with the short dimension being smaller than the anneal wavelength.

In the apparatus, the elongate conductive structures preferably have a surface that is generally rectangular.

In the apparatus, the substantial alignment of the elongate conductive structures preferably includes two or more of the elongate conductive structures being parallel.

In the apparatus, the elongate conductive structures preferably define current-spreading electrodes.

In the apparatus, the short dimension may be smaller than about 10.6 microns.

In the apparatus, the conductive structures may be disposed atop the p-GaN layer. And the apparatus preferably further includes a transparent conducting layer between the conductive structures and the p-GaN layer.

Additional features and advantages of the disclosure will be set forth in the detailed description which follows, and in part will be readily apparent to those skilled in the art from that description or recognized by practicing the disclosure as described herein, including the detailed description which follows, the claims, as well as the appended drawings.

It is to be understood that both the foregoing general description and the following detailed description present embodiments of the disclosure, and are intended to provide an overview or framework for understanding the nature and character of the disclosure as it is claimed. The accompanying drawings are included to provide a further understanding of the disclosure, and are incorporated into and constitute a part of this specification. The drawings illustrate various embodiments of the disclosure, and together with the description serve to explain the principles and operations of the disclosure.

The claims are incorporated into and constitute part of the specification.

Cartesian coordinates are provided in the Figures by way of reference and are not intended to be limiting as to direction or orientation.

DETAILED DESCRIPTION

Reference is now made in detail to the present preferred embodiments of the disclosure, examples of which are illustrated in the accompanying drawings. Whenever possible, the same or like reference numbers and symbols are used throughout the drawings to refer to the same or like parts. The terms "above" and "below" are relative terms used to facilitate the description and are not intended as being strictly limiting.

The invention relates to GaN LEDs. Example GaN LEDs are also described in U.S. Pat. Nos. 6,455,877, 7,259,399 and 7,436,001, which patents are incorporated by reference herein.

Example laser annealing systems suitable for carrying out the methods of the present disclosure are described in U.S. Pat. Nos. 6,747,245, 7,154,066 and 7,399,945, which patents are incorporated by reference herein.

The term "atop" as used herein in connection with the conductive electrodes relative to an underlying layer does not necessarily mean immediately adjacent to or in contact with the underlying layer, and includes the case where the conductive electrodes are above the underlying layer and separated therefrom.

Also, the term "GaN LED structure" as used herein is synonymous with the term "GaN LED apparatus."

Figure 1:
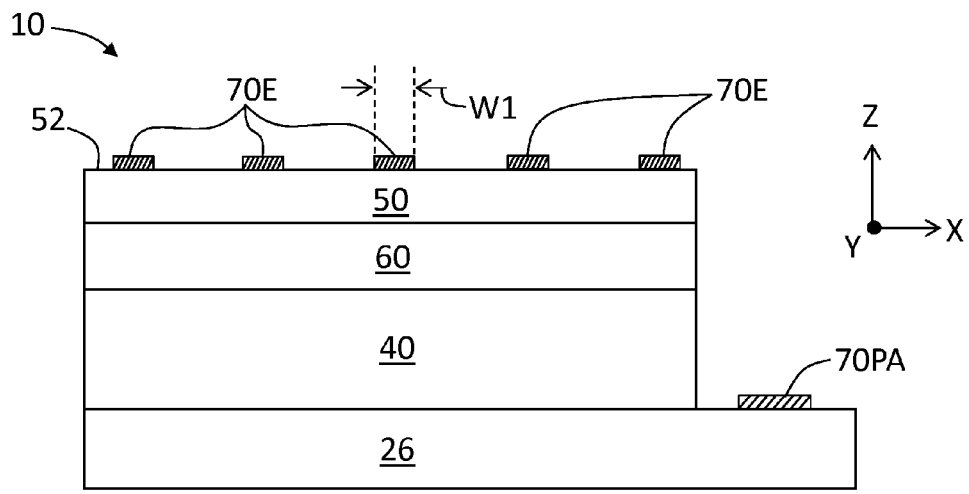
FIG. 1 is a schematic cross-sectional diagram of an example prior art vertical-type GaN light-emitting diode (LED) structure.
Figure 2:
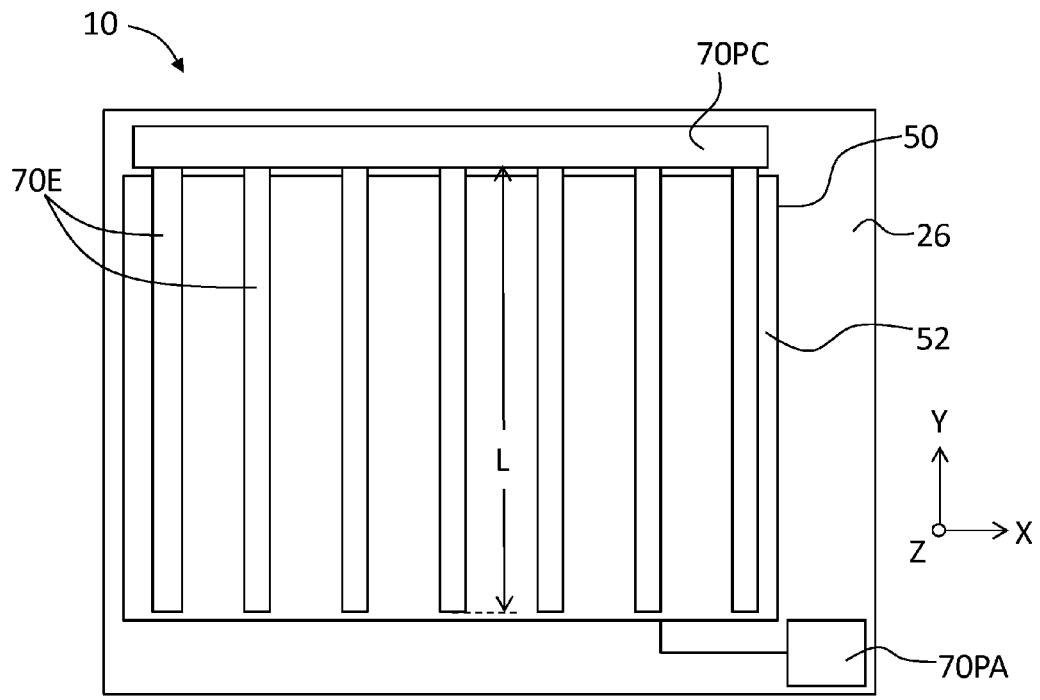
FIG. 2 is a top-down view of the prior art vertical-type GaN LED structure of FIG. 1.

FIG. 1 is a schematic cross-sectional diagram of an example prior art vertical-type GaN light-emitting diode (LED) structure 10. FIG. 2 is a top-down view of the GaN LED structure 10 of FIG. 1. The GaN LED structure 10 includes a GaN multilayer structure 30 that includes a p-doped GaN layer ("p-GaN layer") 40 and an n-doped GaN layer ("n-GaN layer") 50 with a surface 52. The p-GaN layer 40 and the n-GaN layer 50 sandwich an active layer 60, with the p-GaN layer being adjacent substrate 20. The active layer 60 comprises, for example, a multiple quantum well (MQW) structure such as undoped GaInN/GaN superlattices. The GaN multilayer structure 30 thus defines a p-n junction. The GaN LED structure 10 includes a metal electrode 26 bonded to the p-GaN layer 40.

The GaN LED structure 10 comprises conducting structures 70 that include current-spreading electrodes 70E disposed atop an n-GaN layer surface 52. The current-spreading electrodes 70E serve as cathodes and the metal electrode 26 serves as an anode. The current-spreading electrodes 70E serve to spread injected electrons. As best seen in FIG. 2, the conducting structures 70 also include contact pads 70P, namely an n-contact pad 70PC that is electrically connected to the current-spreading electrodes 70E, and a p-contact pad 70PA that is electrically connected to the metal electrode 26.

Figure 3:
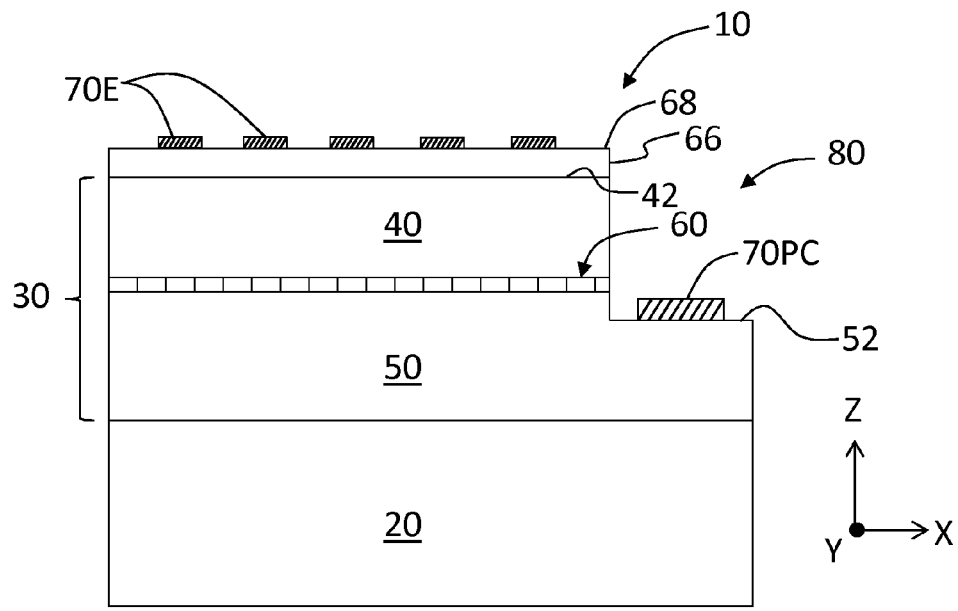
FIG. 3 is a schematic cross-sectional diagram of an example prior art horizontal-type GaN LED structure.
Figure 4:
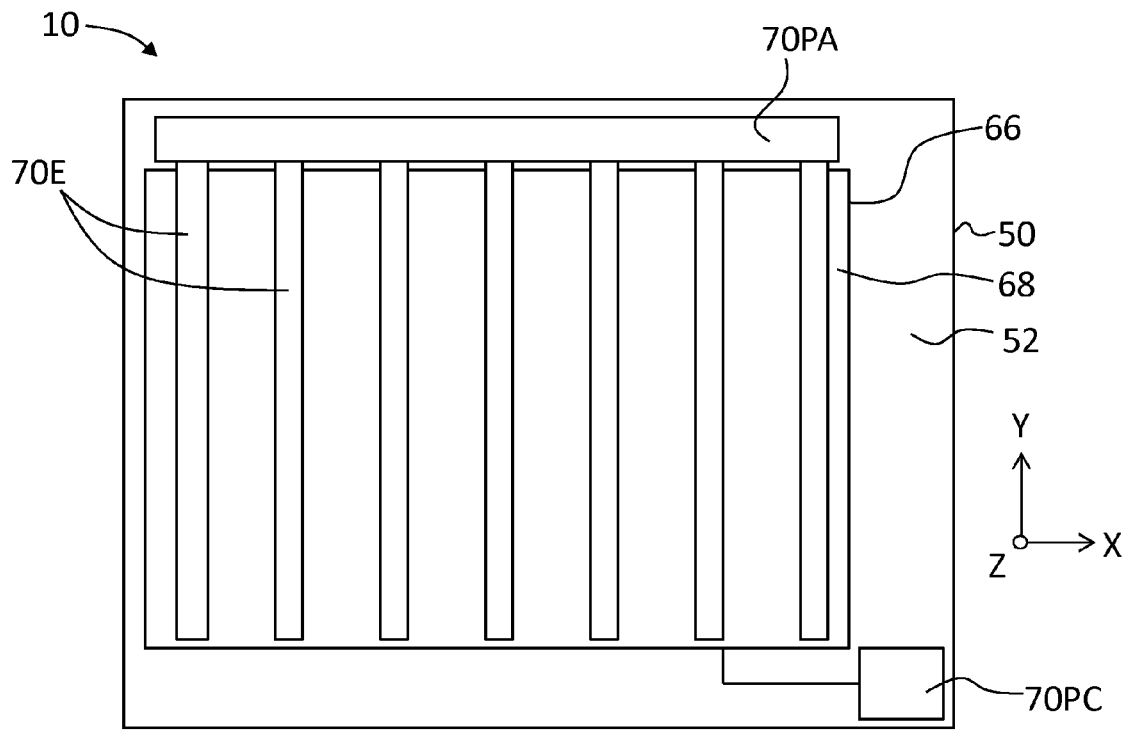
FIG. 4 is a top-down view of the prior art horizontal-type GaN LED structure of FIG. 3.

FIG. 3 is a schematic cross-sectional diagram of a prior art horizontal-type GaN LED structure 10, and FIG. 4 is a top-down view of the GaN LED structure of FIG. 3. The GaN LED structure 10 of FIG. 4 includes a substrate 20 such as sapphire, SiC, GaN Si, etc. Disposed atop substrate 20 is the aforementioned GaN multilayer structure 30, but with the p-GaN layer 40 and the n-GaN layer 50 reversed. The p-GaN layer 40 has a surface 42. Because the conductivity of the p-GaN is relatively poor, the current injected from the current spreading electrodes 70E would be very non-uniform throughout the p-GaN. Hence, in an example, a transparent conducting layer (TCL) 66 with a surface 68 is disposed between the current spreading electrodes 70E and the p-GaN layer 40 to make the current density more uniform as the current enters the p-GaN layer. An example TCL 66 includes indium tin oxide (ITO). TCL 66 can also act as an antireflection coating to optimize optical output. An n-contact pad 70PC is shown atop a portion of surface 52 of n-GaN layer 50.

With continuing reference to FIGS. 1 through 4, the conductive structures 70 in the form of the current-spreading electrodes 70E and the contact pads 70P are typically relatively large, with the X (width) and Y (length) dimensions ranging from 50 to 100 microns in size. A short dimension (width) W1 in the X-direction of the current-spreading electrodes 70E is substantially larger than the anneal wavelength $\lambda_A$. The current-spreading electrodes 70E typically have an elongate shape with a long dimension L (shown as extending in the Y-direction).

Figure 5:
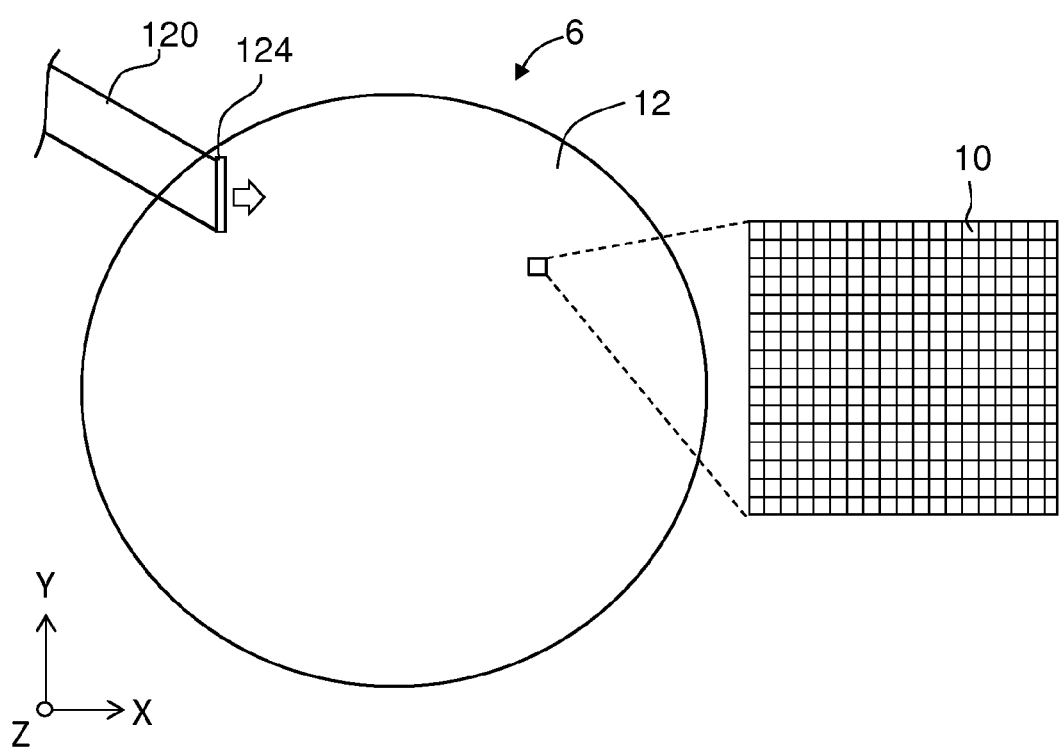
FIG. 5 is a plan view of an example product substrate on which the GaN structures are formed, showing how the annealing laser beam forms a line image that is scanned over the product wafer surface.

FIG. 5 is a plan view of an example product substrate 6 on which GaN LED structures 10 are formed. The close-up inset view of the product substrate 6 shows a number of GaN LED structures 10 that define a surface 12. The product substrate 6 typically supports many thousands of the GaN LED structures 10, each of which has X,Y dimensions on the order of 1 mm.

Also shown in FIG. 5 is anneal laser beam 120 that forms a line image 124 on the surface 12 of the product substrate 6. The line image 124 is scanned across the product wafer surface 12 and thus the GaN LED structures 10 and the particular GaN layer to be annealed, i.e., the p-GaN layer 40 or the n-GaN layer 50, depending on the type of GaN LED structure. An example range for the dwell time $t_d$ for the line image 124 over a particular portion of surface 12 is from about 10 microseconds (μs) to 10 milliseconds (ms). In an example, the line image 124 has a length between 5 mm and 100 mm, with a typical length being between 7 and 20 mm. The line image 124 also has width in the range from about 25 microns to about 500 microns, with a typical width being between 50 microns and 100 microns. An example line image 124 has a power density (intensity) in the range from 50 W/mm² to 5000 W/mm², with an example power density being about 400 W/mm². Example systems and methods for forming an anneal laser beam 120 and the corresponding line image 124 is disclosed in U.S. Pat. No. 8,014,427, which is incorporated by reference herein.

An example range for the maximum anneal temperature associated with the laser annealing process is from about 700° C. to about 1,500° C. The maximum anneal temperature is determined by the amount of GaN disassociation and the lattice mismatch strain relaxation and dislocation in the GaN LED structure 10. The depth of the annealing depends on the dwell time and the laser beam intensity. An example GaN multilayer structure 30 has a thickness of a few to about 10 μm, and the anneal typically reaches from 10 μm to 100 μm, i.e., generally through the GaN multilayer structure 30 and in some cases all the way down to the substrate 20 or the metal electrode (conductor) 26.

Figure 6:
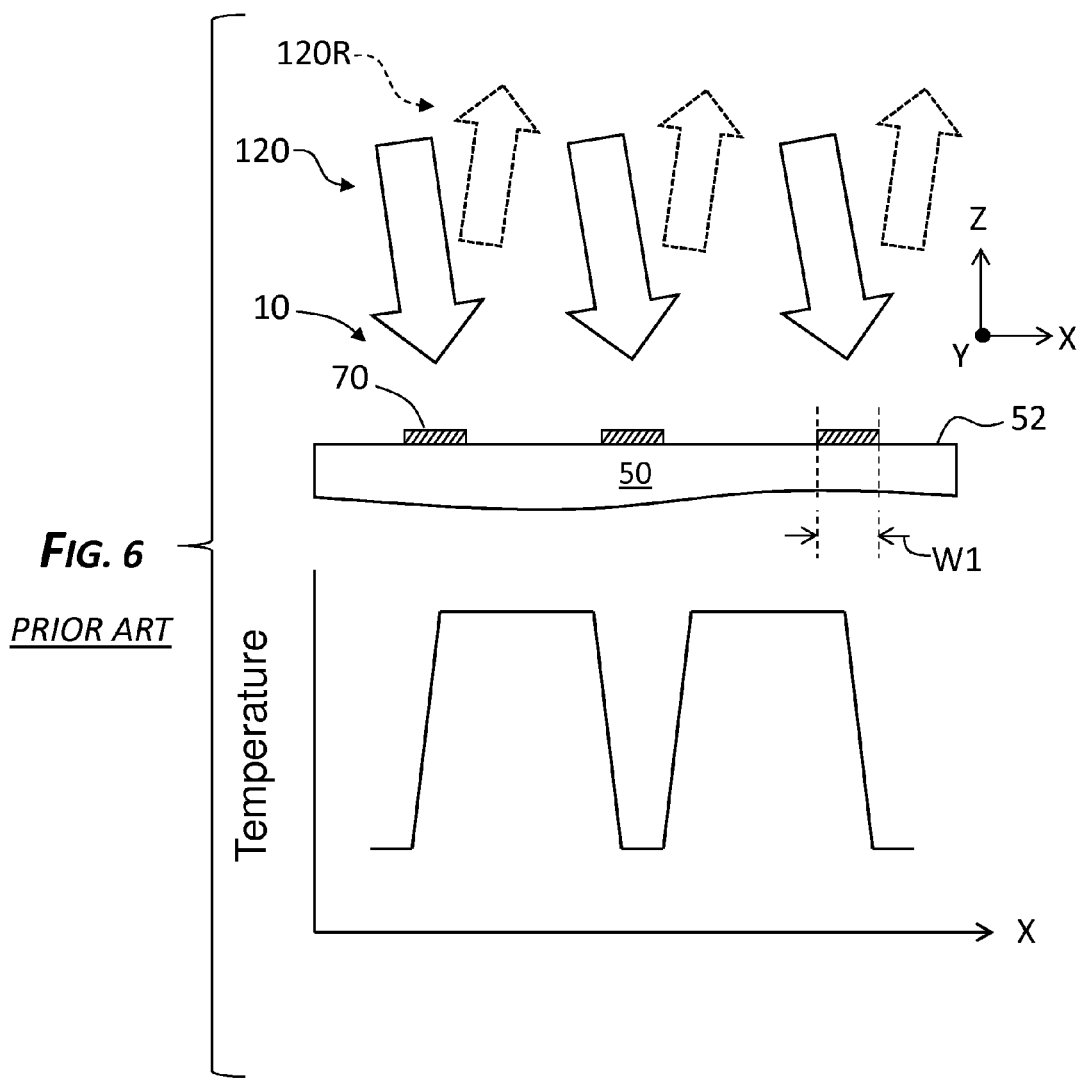
FIG. 6 is a schematic cross-sectional view of the upper portion of the GaN LED structure and shows the GaN LED structure being laser annealed with an anneal laser beam according to the prior art, and also shows a schematic temperature plot versus distance (X) of the upper n-GaN layer on which conductive structures are formed, illustrating the a temperature uniformity due to pattern effects.

FIG. 6 is a schematic cross-sectional view of the upper portion of the GaN LED structure 10 and shows the GaN LED structure 10 being laser annealed with anneal laser beam 120. FIG. 5 also includes a schematic temperature plot versus distance (X) of the upper n-GaN layer on which the conductive structures 70 are formed.

Because the conducting structures 70 are so large relative to the anneal wavelength $\lambda_A$, they reflect a substantial portion of an anneal laser beam 120 used to laser anneal the GaN LED structure 10. Thus, as illustrated in FIG. 6, as annealing laser beam illuminates GaN LED structure 10, the areas under the conducting structures 70 are heated less than regions without these structures, as schematically illustrated in the temperature plot in the lower part of FIG. 6. This leads to the so-called "pattern effects" during the laser annealing process that create local thermal non-uniformities in the annealed layer, which is shown in FIG. 6 as the n-GaN layer 50 by way of illustration.

There are at least three main adverse influences on the GaN LED structure 10 that arise from the thermal non-uniformities due to pattern effects. The first is that the conductivity of the annealed regions varies considerably. The regions with higher thermal annealing temperatures have a higher dopant activation and hence a lower sheet resistance. The second is that the areas directly under the conductive structures 70 are heated to a lower temperature. This increases the local sheet resistance as well as increases the ohmic contact resistance, both of which reduce the efficiency of the LED device. The third is that increasing the laser power so that the regions directly under the contact pads are raised to a sufficiently high temperature to reduce the ohmic contact resistance (or reduce the sheet resistance) can damage the structure in other regions, or can damage the metal contact pads.

It is desirable to heat the particular GaN layer of the GaN LED structure 10 uniformly to increase the total number of dopants activated to uniformly reduce the sheet resistance within the layer. In addition, it is further desirable to heat the regions directly under the conductive structures 70 to a higher temperature in order to decrease the contact resistance. However, this must be accomplished without damaging either the conductive structures 70 or the underlying GaN layer. In present-day annealing of the GaN LED structures 10, the reflectivity from the conductive structures 70 is sufficiently great so that the regions beneath the conductive structures 70 cannot be brought up to a sufficiently high temperature. In other words, present-day annealing of GaN LED structures 10 suffers from the pattern effects caused by trying to anneal the particular GaN layer through the conductive structures 70.

When the anneal laser beam 120 is polarized in a direction parallel to the long dimension L of such conductive structures 70 (e.g., current-spreading electrodes 70E), a portion of the anneal laser beam 120 is reflected. This is because the anneal laser beam 120 drives electrical currents in the conductive structures 70. The electrical currents satisfy Maxwell's equations in a manner that minimizes the tangential electric field at the surface of the conductive structures 70. This creates an electric field that cancels a substantial portion of the transmitted anneal laser beam 120 and produces a reflected anneal laser beam 120R, as shown in FIG. 6.

In an example embodiment of the disclosure, the anneal laser beam 120 is polarized in a polarization direction 122. Further, the conductive structures 70 have the aforementioned elongate shape with an elongate dimension (e.g., in the Y-direction, as shown) but are modified to have a dimension W2 in a short direction (e.g., the X-direction, as shown), wherein W2<W1, and wherein W2 is smaller than anneal wavelength, i.e., W2<$\lambda_A$. In an example, each current-spreading electrode 70E has an upper surface 72E that is generally rectangular. Also in an example, the current-spreading electrodes 70E are aligned such that at least two of the electrodes are parallel, while further in the example all of the electrodes are parallel (see, e.g., U.S. patent application Ser. No. 11/982,788, which describes this effect in the context of annealing metallic structures on silicon wafers for manufacturing CMOS type devices, and which is incorporated by reference herein).

Figure 7A:
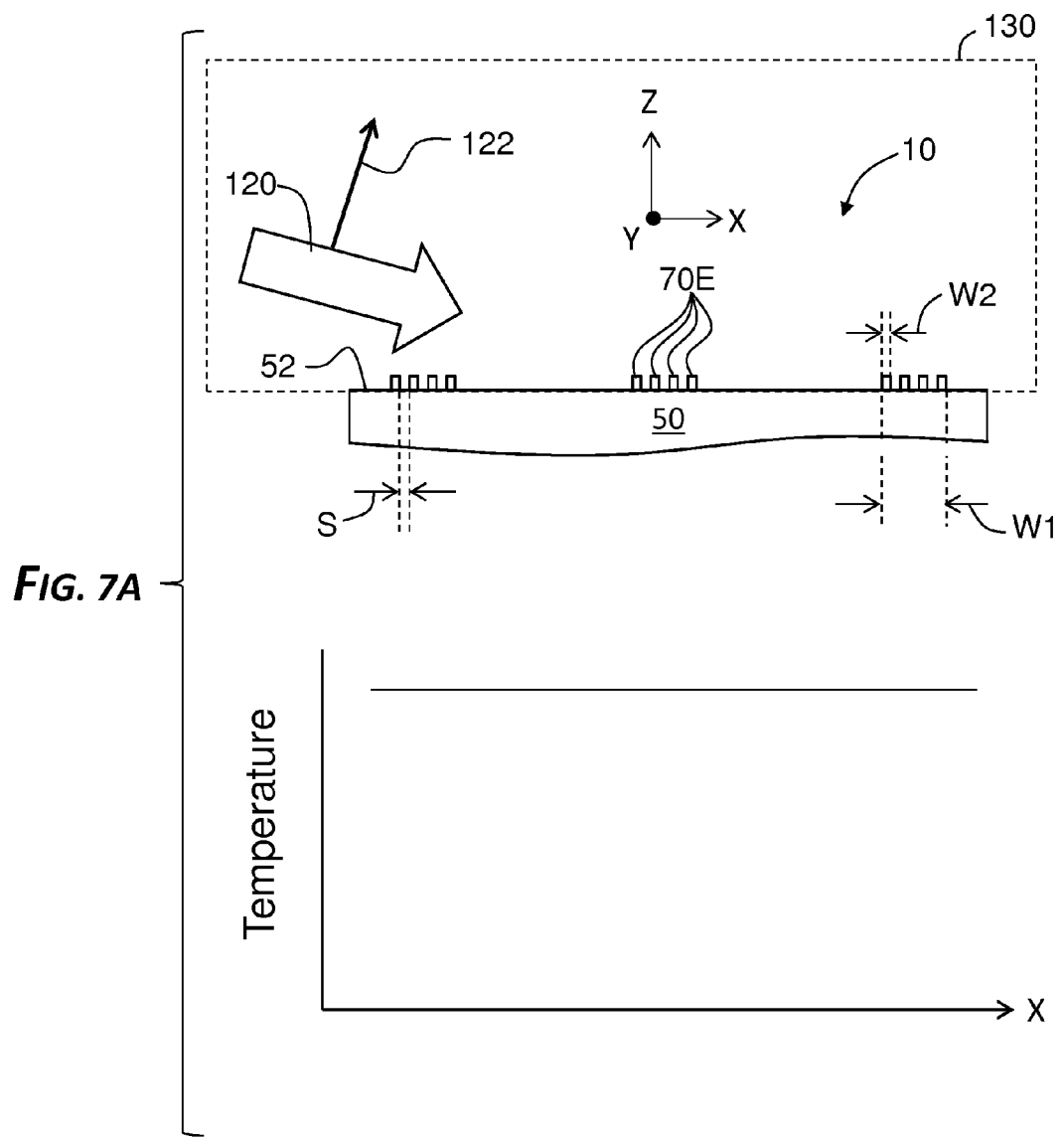
FIG. 7A is a side view of top portion of an example vertical-type GaN LED structure having modified conductive structures, shown being subjected to anneal laser beam as part of a laser anneal process for forming the GaN LED structure according to the present disclosure, with the Figure including a schematic temperature vs. distance (X) plot showing the temperature of the upper n-GaN layer on which the modified conductive structures are formed, illustrating a substantially constant temperature uniformity.
Figure 7B:
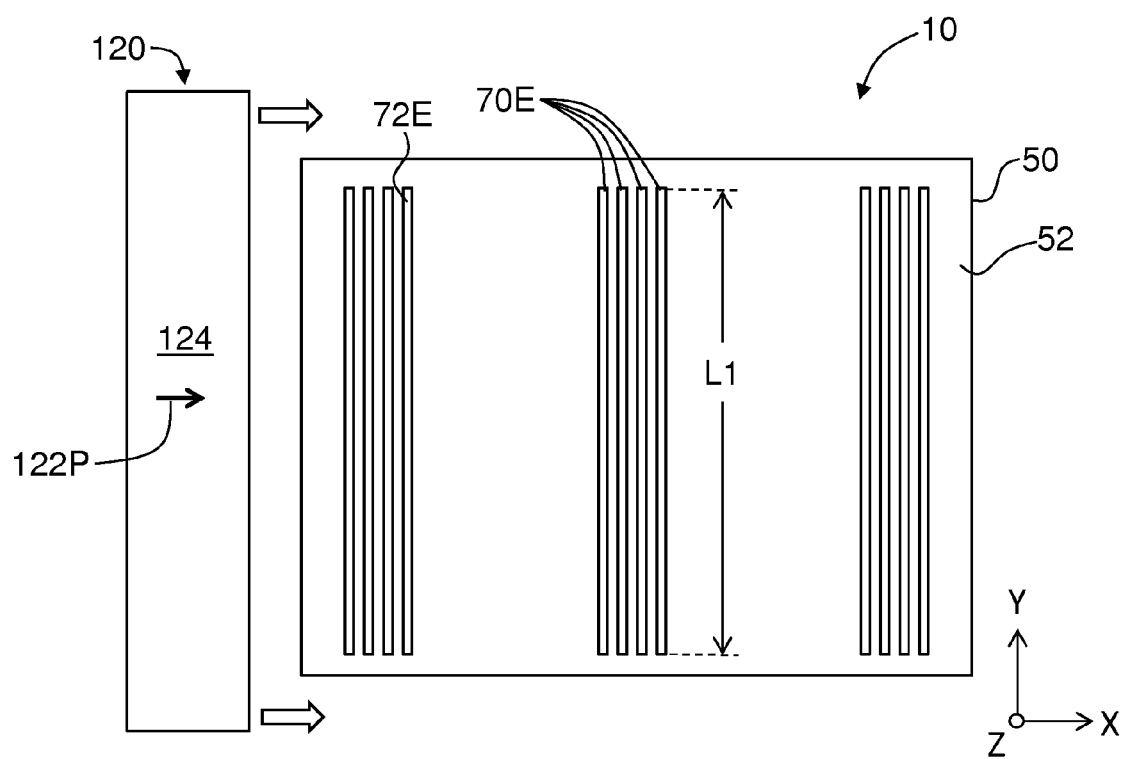
FIG. 7B is a top-down view of the GaN LED structure of FIG. 7A, shown a line image 124 formed by the P-polarized anneal laser beam, with the line image above to be scanned over the GaN LED structure.

FIG. 7A is a side view of top portion of the vertical-type GaN LED structure 10 shown being subjected to the anneal laser beam 120 as part of a laser anneal process for forming the GaN LED structure 10. FIG. 7A includes a schematic temperature vs. distance (X) plot showing the temperature of the upper n-GaN layer 50 on which modified conductive structures 70 are formed, i.e., they have a width dimension W2<$\lambda_A$. FIG. 7B is a top-down view of the GaN LED structure 10 of FIG. 7A, along with the anneal laser beam 120 and shows line image 124 formed by the anneal laser beam 120 as it is about to be scanned over the GaN LED structure 10. The anneal laser beam 120 is P-polarized, i.e., the polarization direction, which is indicated by arrow 122, is in a plane 130 perpendicular to the surface 52 of the n-GaN layer 50. The small arrows in FIG. 7B indicate the scanning direction of the line image 124.

Note that in FIG. 7A and FIG. 7B, the anneal laser beam 120 has a direction such that the polarization (or more accurately, its polarization component 122 as projected onto the surface 52 of the n-GaN layer 50) is perpendicular to the long direction of the current-spreading electrodes 70E. In this laser annealing geometry, substantially all of the anneal light beam 120 passes through the current-spreading electrodes 70E and into the underlying GaN layer (shown in FIG. 7A by way of example as the n-GaN layer 50). This is true even if the current-spreading electrodes have an infinite conductivity. This is because the width W2 of the current-spreading electrodes 70E is sub-wavelength, i.e., $\lambda_A$>W2, and this dimension is too small to allow for any substantial electrical current to be driven by the electric field of the anneal laser beam 120. Consequently, there is no generated electric field in the conductive structures 70 that could cancel the transmitted portion of the anneal laser beam 120 and give rise to a reflected anneal laser beam 120R, such as shown in FIG. 6. In the example configuration of FIGS. 7A and 7B, some of the current-spreading electrodes 170E are grouped together and spaced apart within each group by a spacing S, which in an example equals W2.

Thus, an example annealing method of the GaN LED structure 10 according to the disclosure includes: a) forming elongate conductive structures 70 atop either n-GaN layer 50 or p-GaN layer 40 of the GaN LED structure 10, the elongate conductive structures 70 having long and short dimensions, and being spaced apart and substantially aligned in the long dimensions L; b) generating P-polarized anneal laser beam 120 that has an anneal wavelength $\lambda_A$ that is greater than the short dimension; and c) irradiating either the n-GaN layer 50 or the p-GaN layer 40 of the GaN LED structure 10 through the conductive structures 70 with the P-polarized anneal laser beam 120, including directing the anneal laser beam relative to the conductive structures 70 so that the polarization direction 122 is perpendicular to the long dimension L of the conductive structures 70.

In an example, a P-polarized anneal laser beam 120 is generated by a $CO_2$ laser that provides an anneal wavelength $\lambda_A$=10.6 microns. Also in an example, conductive structures 70 that have a dimension $\lambda_A$>W2 has substantially the same amount of surface area as prior art conductive structures that have a smallest dimension W1>$\lambda_A$. This can be accomplished for example by splitting up the relative wide current-spreading electrodes 70E that have a width W1 and splitting them up into a number of additional electrodes having a width W2. For example, a current-spreading electrode having a width W1=50 microns can be redistributed into ten current-spreading electrodes having a width W2 and that are spaced apart by spacing S=5 microns (see FIG. 6A). This way, the same amount of current can be carried in the network of thinner current-spreading electrodes as is carried in the network of wider current-spreading electrodes, but with the added benefit that the pattern effects are reduced or minimized.

An alternative to making ten 5-micron current-spreading electrodes 70E is to make fewer 5-micron current-spreading electrodes, but make them thicker (i.e., in the Z-direction), so that each current-spreading electrode 70E is capable of carrying a greater amount of current because each has a greater volume due to the increased thickness. In an example, current-spreading electrodes 70E are spread out evenly atop the GaN LED structure 10 to help improve the current spreading by making it more uniform.

Figure 8A:
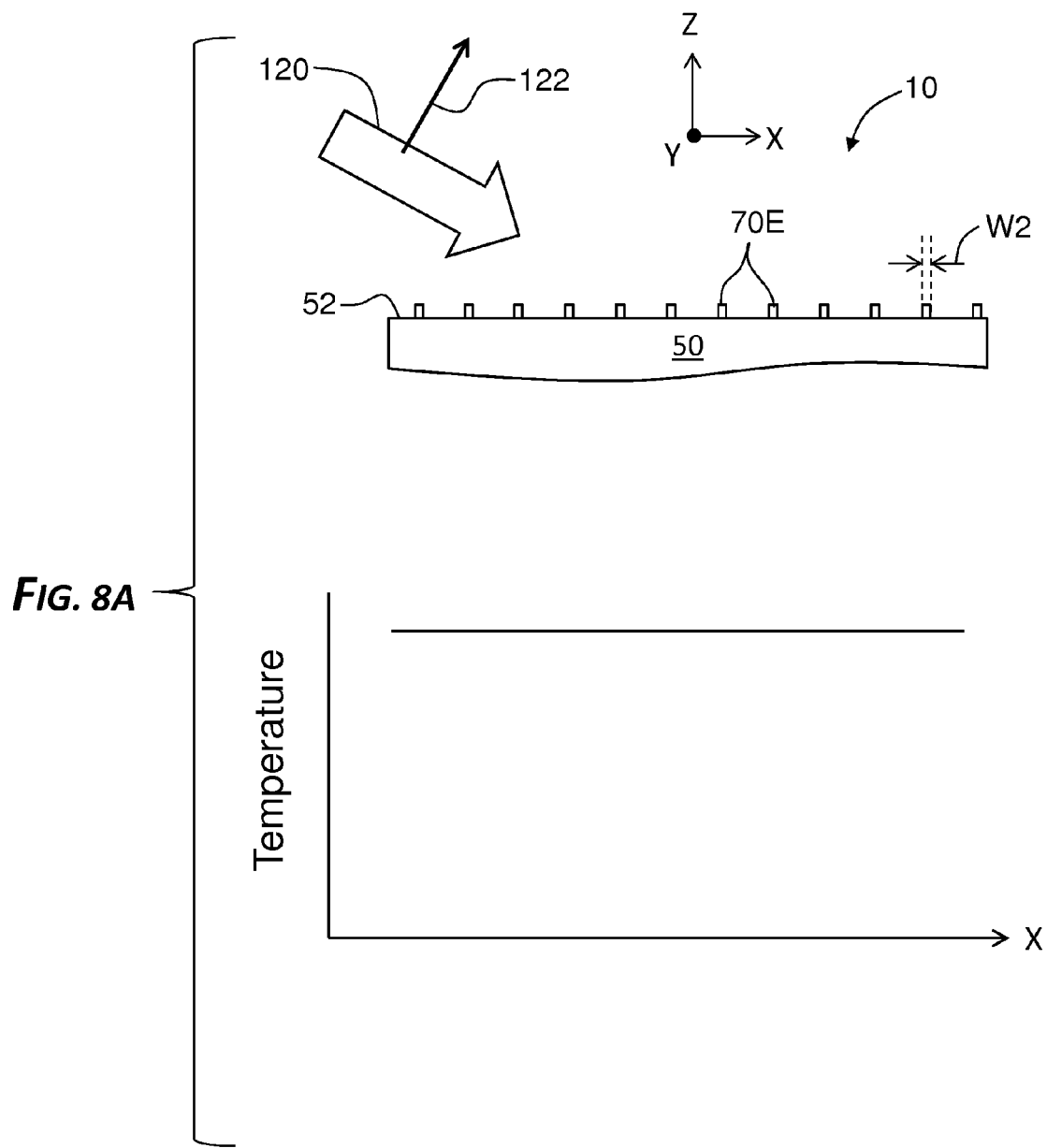
FIG. 8A and FIG. 8B are similar to FIG. 7A and FIG. 7B, but show an another example configuration of the modified conductive structures.
Figure 8B:
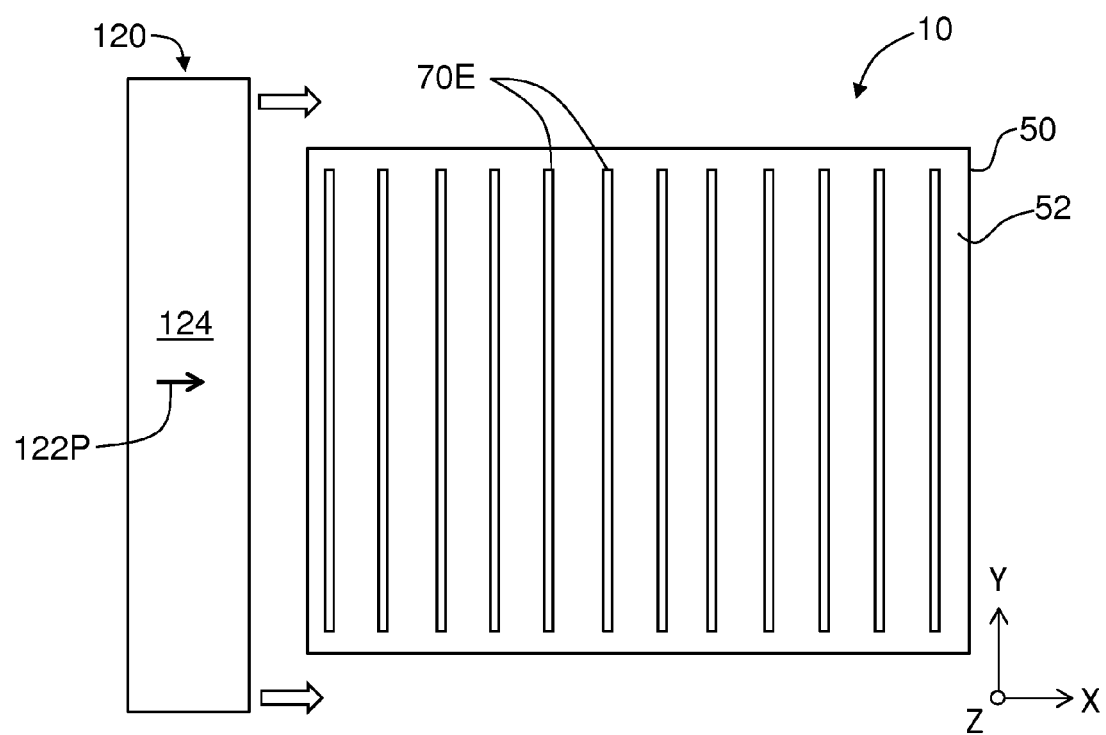
Figure 9A:
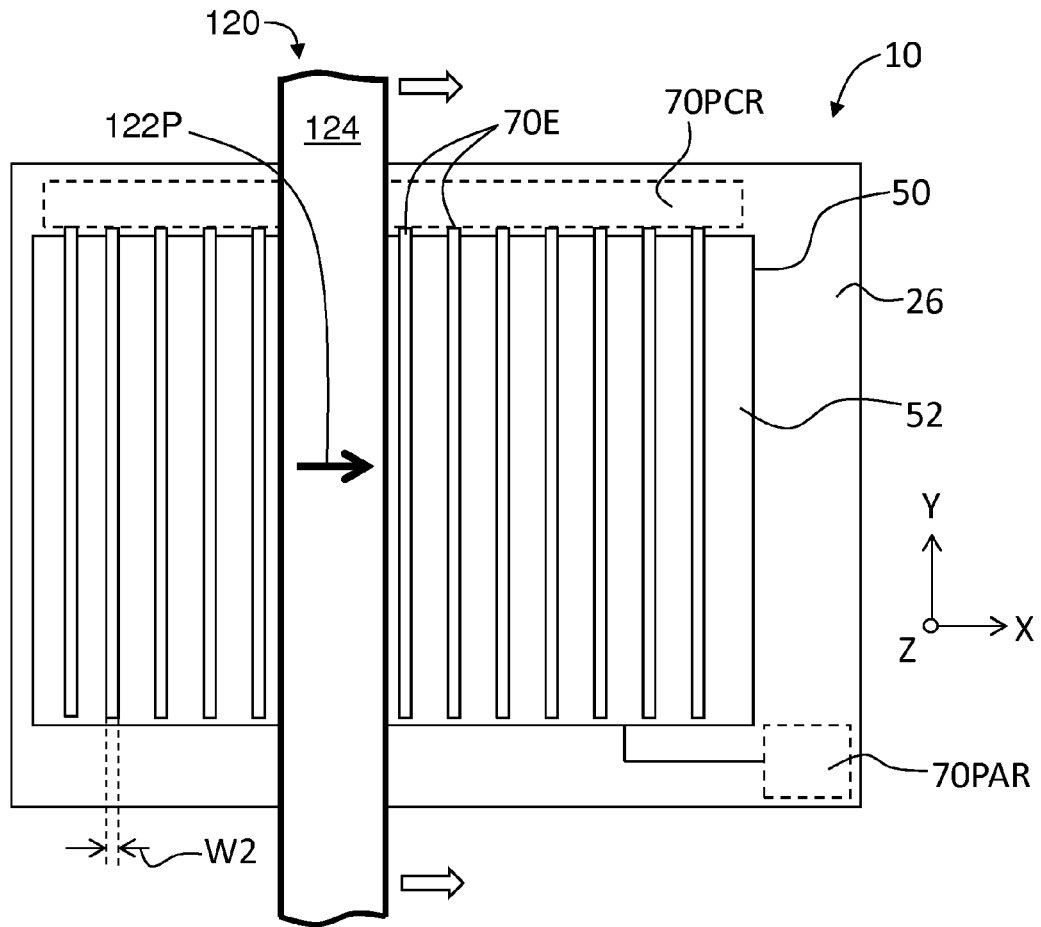
FIG. 9A is similar to FIG. 8B and shows an example configuration of the modified current-spreading electrodes being laser annealed by a scanned line image, prior to forming the anode and the cathode contact pads in the anode and cathode contact pad regions (dashed lines)
Figure 9B:
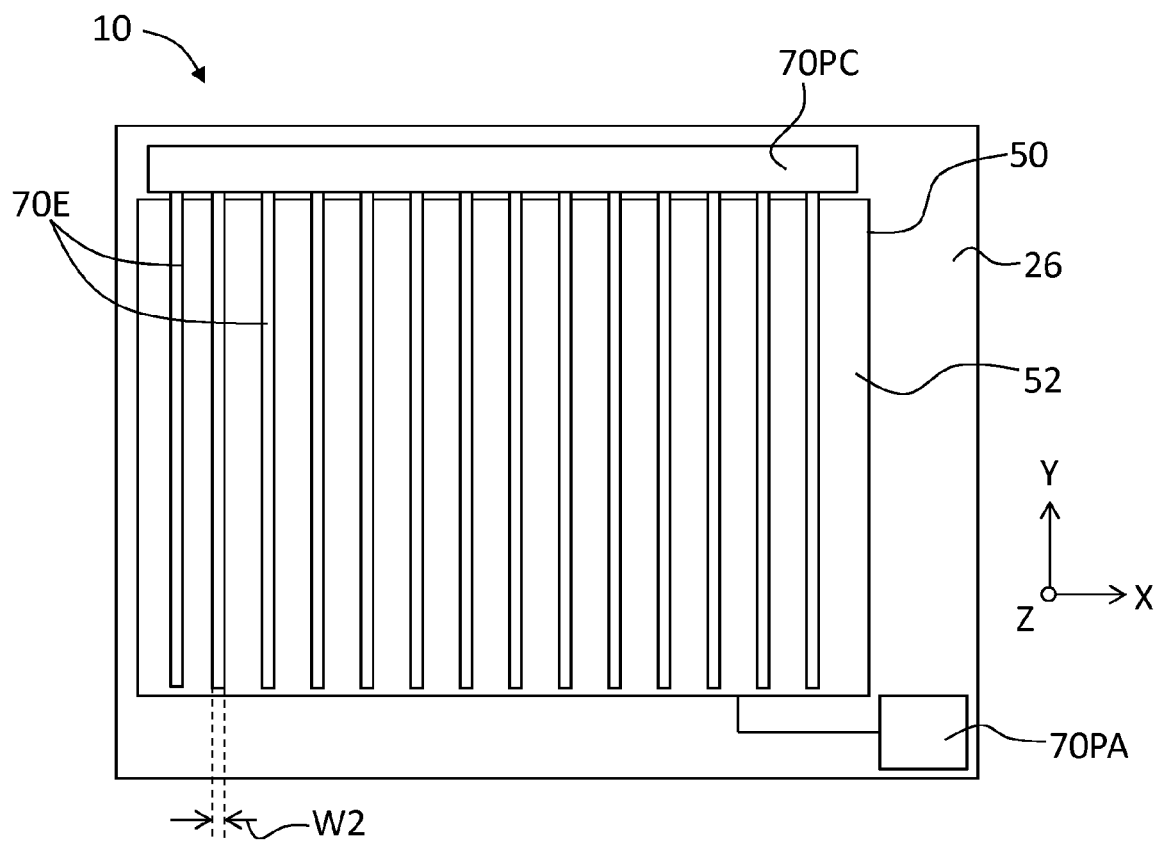
FIG. 9B is a top-down view of the example configuration of the modified current-spreading electrodes of FIG. 9A, after forming the anode and the cathode contact pads.

An aspect of the disclosure includes modifying both the current-spreading electrodes 70E and the contact pads 70P to reduce or minimize adverse pattern effects. FIG. 9A is similar to FIG. 8B and shows modified current-spreading electrodes 70E that extend into the cathode contact pad region 70PCR where the cathode contact pad 70PC is to be formed (dashed line rectangle). FIG. 9A also shows an anode contact pad region 70PAR wherein the anode contact pad 70PA is to be formed (dashed line square).

Upon laser annealing with the anneal laser beam 120, the current-spreading electrodes 70E form low-resistance ohmic contacts with the particular GaN layer (e.g., n-GaN layer 50, as shown) underneath. After the laser annealing through the current spreading electrodes 70E is carried out, then in a subsequent step contact pads 70PC and 70PA are formed, e.g., by depositing metal in both the cathode contact pad region 70PCR (including over the ends of the current-spreading electrodes) and in the anode contact pad region 70PAR (which is a metal substrate in the vertical LED geometry), to complete the electrical connections needed for the GaN LED structure 10.

The GaN laser annealing system and methods disclosed herein provide a number of advantages over prior art GaN laser annealing systems and methods. A first advantage is that it can serve to improve the sheet resistance uniformity throughout the GaN regions (both p and n type) that are subjected to laser annealing through the conductive structures 70. A second advantage is improved ohmic contact resistance of the conductor-GaN interface. A third advantage is a reduced threshold voltage for the LED device, which improves the LED device efficiency and reduces the amount generated heat during device operation.

Figure 10:
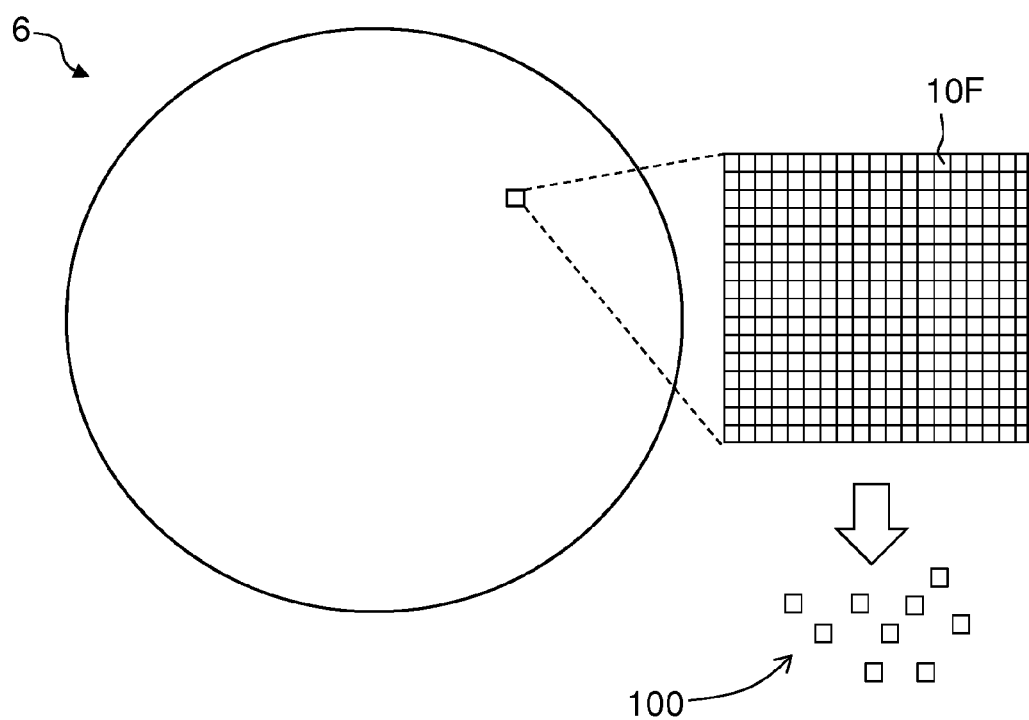
FIG. 10 is a plan view of an example product wafer similar to that of FIG. 5, but after performing laser annealing to form functional GaN LED structures, and showing how the product wafer is diced to form LED dies from the functional GaN LED structures.

FIG. 10 is a plan view of a product substrate 6 after laser annealing. Once GaN LED structures 10 supported by product substrate 6 are laser annealed as described above, the GaN LED structures 10 become functional GaN LED structures 10F that can serve as LED light sources. Accordingly, the product substrate 6 is then diced to form LED dies 100 from the functional GaN LED structures 10F. The LED dies 100 are processed using techniques known in the art.

Figure 11:
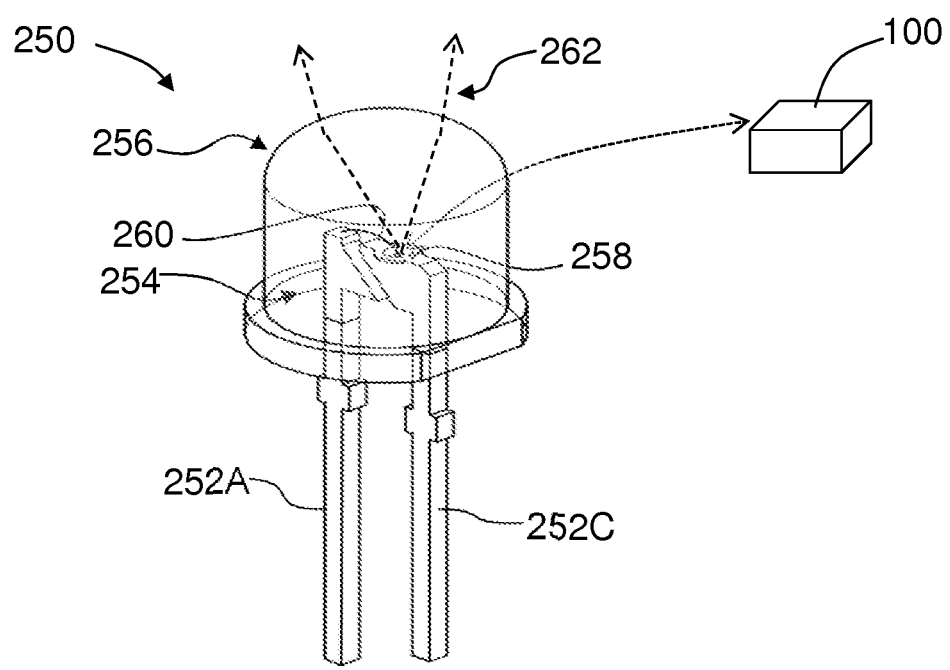
FIG. 11 shows an example LED device formed using one of the LED dies.

The LED dies 100 are then incorporated into a LED device structure to form an LED device 250, such as illustrated in FIG. 11. The LED device 250 of FIG. 11 includes an anode 252A and a cathode 252C that extend into an interior 254 of an epoxy lens casing 256. The cathode 252C includes a reflective cavity 258 in which the LED die 100 resides. Wire bonds 260 electrically connect the anode 252A and the cathode 252C to the LED die 100. A power source (not shown) connects to the anode 252A and the cathode 252C to provide the electricity needed to power the LED device 250 so that it emits light 262 at an LED emission wavelength $\lambda_E$.

It will be apparent to those skilled in the art that various modifications and variations can be made to the present disclosure without departing from the spirit and scope of the disclosure. Thus it is intended that the present disclosure cover the modifications and variations of this disclosure provided they come within the scope of the appended claims and their equivalents.

What is claimed is:
1. A method of laser annealing a GaN light-emitting diode (LED) structure, comprising
   forming elongate conductive structures atop either an n-GaN layer or a p-GaN layer of the GaN LED structure, the elongate conductive structures having long and short dimensions, and being spaced apart and substantially aligned in the long dimensions;

generating a P-polarized anneal laser beam that has an anneal wavelength that is greater than the short dimension; and irradiating either the n-GaN layer or the p-GaN layer of the GaN LED structure through the conductive structures with the P-polarized anneal laser beam, including directing the anneal laser beam relative to the conductive structures so that the polarization direction is perpendicular to the long dimension of the conductive structures.

2. The method of claim 1, wherein the elongate conductive structure has a surface that is generally rectangular.

3. The method of claim 1, wherein the substantial alignment of the elongate conductive structures includes two or more of the elongate conductive structures being parallel.

4. The method of claim 1, wherein the elongate conductive structures define current-spreading electrodes.

5. The method of claim 4, further comprising, after said irradiating, adding at least one contact pad that electrically contacts the current-spreading electrodes.

6. The method of claim 1, wherein the anneal wavelength is about 10.6 microns.

7. The method of claim 1, further comprising scanning with the anneal laser beam over the conductive structures.

8. The method of claim 1, wherein the GaN LED structures are formed on a product substrate and further comprising:

dicing the product substrate to form LED dies from the GaN LED structures.

9. The method of claim 8, further comprising incorporating the LED dies into an LED device structure to form an LED device.

10. A GaN light-emitting diode (LED) apparatus suitable for laser annealing with a P-polarized anneal laser beam having an anneal wavelength, comprising:

a GaN multilayer structure that includes p-GaN and n-GaN layers that sandwich an active layer; and a plurality of conductive structures formed atop either the p-GaN layer or the n-GaN layer, the conductive structures each being elongate with a long dimension and a short dimension and aligned generally in the same direction, with the short dimension being smaller than the anneal wavelength.

11. The apparatus of claim 10, wherein the elongate conductive structures have a surface that is generally rectangular.

12. The apparatus of claim 10, wherein the substantial alignment of the elongate conductive structures includes two or more of the elongate conductive structures being parallel.

13. The apparatus of claim 10, wherein the elongate conductive structures define current-spreading electrodes.

14. The apparatus of claim 10, wherein the short dimension is smaller than about 10.6 microns.

15. The apparatus of claim 10, wherein the conductive structures are disposed atop the p-GaN layer, and further including a transparent conducting layer between the conductive structures and the p-GaN layer.

\* \* \* \* \*